(12) United States Patent
Yamagishi et al.

(10) Patent No.: US 8,119,321 B2
(45) Date of Patent: Feb. 21, 2012

(54) RESIST POLYMER SOLUTION AND PROCESS FOR PRODUCING THE SAME

(75) Inventors: Takanori Yamagishi, Funabashi (JP); Hiromitsu Baba, Ichihara (JP)

(73) Assignee: Maruzen Petrochemical Co., Ltd., Tokyo (JP)

( * ) Notice: Subject to any disclaimer, the term of this patent is extended or adjusted under 35 U.S.C. 154(b) by 0 days.

(21) Appl. No.: 10/582,513

(22) PCT Filed: Dec. 10, 2004

(86) PCT No.: PCT/JP2004/018494
§ 371 (c)(1), (2), (4) Date: Jun. 9, 2006

(87) PCT Pub. No.: WO2005/057288
PCT Pub. Date: Jun. 23, 2005

(65) Prior Publication Data
US 2007/0111137 A1    May 17, 2007

(30) Foreign Application Priority Data
Dec. 11, 2003   (JP) .................................. 2003-413627

(51) Int. Cl.
*G03F 7/004* (2006.01)
*C08F 6/06* (2006.01)

(52) U.S. Cl. ..................... 430/270.1; 528/480; 528/491; 523/332; 523/340

(58) Field of Classification Search ............... 430/270.1, 430/281.1, 326; 523/332, 340; 528/480, 528/491, 493, 494, 496
See application file for complete search history.

(56) References Cited

U.S. PATENT DOCUMENTS

| | | | | |
|---|---|---|---|---|
| 4,420,610 A | * | 12/1983 | Sehm | 528/501 |
| 5,242,991 A | * | 9/1993 | Burch et al. | 525/420 |
| 5,391,671 A | * | 2/1995 | Tazaki et al. | 526/347 |
| 5,939,511 A | * | 8/1999 | Zampini et al. | 528/143 |
| 6,150,069 A | * | 11/2000 | Jung et al. | 430/270.1 |
| 6,277,546 B1 | * | 8/2001 | Breyta et al. | 430/322 |
| 2001/0021479 A1 | * | 9/2001 | Kawabe et al. | 430/170 |
| 2002/0009668 A1 | * | 1/2002 | Nishimura et al. | 430/270.1 |
| 2002/0058201 A1 | * | 5/2002 | Miyaji et al. | 430/270.1 |
| 2003/0032192 A1 | * | 2/2003 | Haubold et al. | 436/56 |
| 2004/0242798 A1 | * | 12/2004 | Sounik et al. | 525/333.3 |

FOREIGN PATENT DOCUMENTS

| | | |
|---|---|---|
| JP | 64 10239 | 1/1989 |
| JP | 2 27660 | 6/1990 |
| JP | 3 223860 | 10/1991 |
| JP | 4 104251 | 4/1992 |
| JP | 4 219757 | 8/1992 |
| JP | 5 113687 | 5/1993 |
| JP | 5 69420 | 10/1993 |
| JP | 7 209868 | 8/1995 |
| JP | 9 73173 | 3/1997 |
| JP | 10 186662 | 7/1998 |
| JP | 10 239846 | 9/1998 |
| JP | 11 65120 | 3/1999 |
| JP | 2001 125269 | 5/2001 |
| KR | 2001-113521 | 12/2001 |
| WO | 99 31157 | 6/1999 |

* cited by examiner

*Primary Examiner* — Anca Eoff
(74) *Attorney, Agent, or Firm* — Oblon, Spivak, McClelland, Maier & Neustadt, L.L.P.

(57) ABSTRACT

A resist polymer solution comprising a resist polymer containing a repeating unit decomposed by the action of an acid so as to be soluble in alkali and a repeating unit having a polar group, the resist polymer dissolved in a solvent for coating film formation, wherein the amount of impurities whose boiling point is not higher than that of the solvent for coating film formation is 1 mass % or less based on the resist polymer. Further, there is provided a process for producing a resist polymer solution, comprising the step (1) of redissolving a solid matter containing a resist polymer in a solvent for coating film formation (a) and/or a solvent (b) whose boiling point at atmospheric pressure is not higher than that of the solvent (a); and the impurity removing step (2) of distilling off the solvent (b) and/or any excess amount of solvent (a) in vacuum from the redissolution solution obtained in the step (1).

12 Claims, No Drawings

RESIST POLYMER SOLUTION AND PROCESS FOR PRODUCING THE SAME

TECHNICAL FIELD

The present invention relates to a resist polymer solution and a process for producing the same. More particularly, the present invention relates to a resist polymer solution which can be suitably used for a radiation resist used in semiconductor lithography and to a process for efficiently and stably producing the resist polymer solution.

BACKGROUND ART

In the lithographic technology for producing semiconductors, capability of forming more detailed patterns is demanded in accordance with an increase in the degree of integration. Wavelength reduction of the exposure light source is indispensable for miniaturization of patterns. At present, lithography using a krypton fluoride (KrF) excimer laser (wavelength: 248 nm) is acquiring a mainstream position. In addition, lithography with line and space width of 100 nm or less using an argon fluoride (ArF) excimer laser (wavelength: 193 nm) is being put into practice. Lithographic technologies using other short wavelength radiations such as a fluorine dimer ($F_2$) excimer laser (wavelength: 157 nm), extreme ultraviolet radiation (EUV), X-rays, and electron beams are also in the stage of development.

In these semiconductor lithographic technologies, resist coatings for forming patterns on substrates by utilizing the properties of the resist of changing the solubility in an alkaline developer by the action of an acid after transferring a pattern profile onto the substrates, as well as other various coatings on the upper layer or under layer of the resist coatings are used. In the resist polymers used in semiconductor lithography, there are a negative-tone resist polymer of which the solubility in an alkaline developer decreases by the action of an acid generated by exposure to radiation and a positive-tone resist polymer of which the solubility in an alkaline developer increases by the action of such an acid.

Of these, the positive-tone resist polymer comprises a repeating unit having a structure with a non-polar substituent which dissociates by the action of an acid and produces a polar group soluble in an alkali developer and a repeating unit having a polar group for increasing adhesion to a semiconductor substrate as essential components and, optionally, another repeating unit having a polar or non-polar substituent for adjusting the solubility in a resist solvent or an alkaline developer. As the repeating unit having a polar group for providing adhesiveness to a semiconductor substrate, hydroxylstyrenes are mainly used when a KrF excimer laser is used as a radiation source, for example. When an ArF excimer laser is used, the use of (meth)acrylate having a polar group has been studied, because hydroxystyrenes absorb light with a wavelength of 193 nm.

As specific examples of such a positive-tone resist polymer used for KrF excimer laser, resist polymers in which a (meth)acrylic acid monomer is combined with a styrene monomer (e.g. Patent Documents 1-4), polymers in which a part of hydroxystyrenes is protected by acetal (e.g. Patent Documents 5-8), and the like can be given. As resist polymers used for ArF excimer laser, polymers of (meth)acrylic acid monomer having a lactone structure (e.g. Patent Documents 9-10), and the like are known.

Resist patterns are formed by semiconductor lithography in the following manner. First, a resist composition solution, prepared by dissolving a resist polymer, a photoacid generator, and, optionally, additives such as an acid diffusion inhibitor in a solvent for coating film formation, is applied to a semiconductor substrate by spin coating or the like. The coating is prebaked to remove the solvent, thereby obtaining a thin film of which the main component is a resist polymer. The thin film is irradiated with light through a mask pattern to cause an acid to be generated in the irradiated part, optionally followed by heating. Since the irradiated part of the positive-tone resist polymer becomes soluble in alkali, a resist pattern can be formed by washing off the irradiated part with water after developing with an alkaline aqueous solution, followed by drying. On the other hand, in the case of the negative-tone resist polymer, in which the irradiated part becomes insoluble in alkali, a resist pattern can be formed by washing off the non-irradiated part with water after developing using an alkaline aqueous solution, followed by drying.

As the solvent for forming a coating used in the resist composition, usually a solvent with a boiling point of 140° C. or more under atmospheric pressure can be used. A part of this solvent remains in the thin film without being completely removed by prebaking. If any impurities other than the solvent for coating film formation remain in the thin film, problems such as change of the lithographic characteristics and volatilization of the solvent during the irradiation process occur, resulting in damage to high precision irradiation equipment. For this reason, there is a demand for removing as much of these impurities as possible from the composition for semiconductor lithography.

As the impurities other than the above-mentioned solvents for coating-film formation, in addition to compounds used in or originating from production of the resist polymer such as unreacted monomers, polymerization initiators, chain transfer agents, coupling products of these, polymerization solvents, purified solvents, water, and the like, compounds originating from the outside environment can be given.

Of these, impurities originating from the polymerization reaction such as unreacted monomers, polymerization initiators, chain transfer agents, coupling products of these, and polymerization solvents can be removed in a purification step after polymerization.

However, impurities having a boiling point lower than the boiling point of the solvent for coating-film formation under atmospheric pressure such as a purification solvent used in the purification step, water introduced during the purification step or operations after the purification step, and the like have conventionally been removed in a vacuum drying step in which the resist polymer is dried using a stirring-type, rotation-type, shelf-type, or spray-type vacuum drier. Resist polymers have therefore been supplied in the form of a powder.

However, because the impurities such as a solvent used in the purification step and water are incorporated in the resist polymer and can be removed only with difficulty, the resist polymers must be heated at as high a temperature and for as long a period of time as possible in order to remove such impurities in the vacuum drying step. The resist polymers containing repeating units which are decomposed and become alkali-soluble by the action of an acid, however, are easily decomposed by heating. A part of the acid-decomposable repeating units are decomposed during the vacuum drying step requiring heating at a high temperature for a long period of time by the catalytic action of acidic substances, such as a very small amount of carboxylic acid, carboxylic acid halide, hydrogen halide, and the like that originate from the raw materials or are produced during the production process, or by impurities such as water and alcohols originating from the raw materials or introduced during the production process.

For these reasons, a process for producing resist polymers containing impurities only to a minimal extent and being capable of efficiently removing solvents used for purification and impurities introduced after the purification step without decomposing a part of acid-decomposable repeating units has been desired.

[Patent document 1] Japanese Patent Application Laid-open No. 59-045439
[Patent document 2] Japanese Patent Application Laid-open No. 5-113667
[Patent document 3] Japanese Patent Application Laid-open No. 7-209868
[Patent document 4] Japanese Patent Application Laid-open No. 11-065120
[Patent document 5] Japanese Patent Application Laid-open No. 62-115440
[Patent document 6] Japanese Patent Application Laid-open No. 4-219757
[Patent document 7] Japanese Patent Application Laid-open No. 3-223860
[Patent document 8] Japanese Patent Application Laid-open No. 4-104251
[Patent document 9] Japanese Patent Application Laid-open No. 9-073173
[Patent document 10] Japanese Patent Application Laid-open No. 10-239846
[Patent document 11] Japanese Patent Application Laid-open No. 2001-125269
[Patent document 12] WO 9931157 International Publication pamphlet
[Patent document 13] Japanese Patent Application Laid-open No. 10-186662
[Patent document 14] Japanese Patent Application Laid-open No. 64-10239

DISCLOSURE OF THE INVENTION

Problems to be Solved by the Invention

The present invention has been achieved in view of the above technological background and has an object of providing a resist polymer, which can be suitably used for a resist film-forming composition used for forming detailed patterns, containing impurities, which may change lithographic characteristics or damage irradiation equipment in semiconductor lithography, only to a minimal extent, and a process for efficiently producing the resist polymer without decomposing a part of acid-decomposable repeating units.

Means for the Solution of the Problems

As a result of extensive studies to achieve the above object, the present inventors have found that this object can be achieved by a resist polymer solution prepared by dissolving a resist polymer in a solvent for coating-film formation by a specific process. This finding has led to the completion of the present invention.

Accordingly, the present invention provides a resist polymer solution prepared by dissolving a resist polymer, which comprises a repeating unit decomposable by the action of an acid and becoming alkali-soluble and a polar group-containing repeating unit, in a solvent for coating-film formation, wherein the amount of impurities having a boiling point of not more than the boiling point of the solvent for coating-film formation is 1 mass % or less of the resist polymer.

The present invention further provides a process for producing a resist polymer solution comprising the following steps (1) and (2):

(1) a redissolving step of redissolving a solid product containing the resist polymer in a solvent containing at least one solvent for coating-film formation (solvent (a)) and/or at least one solvent having a boiling point at atmospheric pressure not higher than the boiling point of the solvent (a) (solvent (b)) and (2) an impurity-removing step of evaporating the solvent (b) and/or any excessive amount of solvent (a) from the redissolved solution obtained in the step (1) while optionally adding the solvent (a) under reduced pressure.

Effect of the Invention

According to the present invention, low-boiling-point impurities having a boiling point not higher than the boiling point of the solvent for coating-film formation under atmospheric pressure can be sufficiently removed and a resist polymer solution containing a polymer in which the acid-decomposable repeating units are preserved can be efficiently produced, even though the process is carried out at a comparatively low temperature for a short period of time. Stable lithographic characteristics can be attained and an adverse effect of volatile matter on irradiation equipment can be prevented by using this resist polymer solution in semiconductor lithography.

BEST MODE FOR CARRYING OUT THE INVENTION

The resist polymer contained in the resist polymer solution of the present invention comprises a repeating unit decomposable by the action of an acid and becoming alkali-soluble (hereinafter referred to as "unit A") and a repeating unit having a polar group for increasing adhesion to a semiconductor substrate (hereinafter referred to as "unit B") and, optionally, another repeating unit having a non-polar substituent for adjusting the solubility in a resist solvent or an alkaline developer (hereinafter referred to as "unit C"). Any resist polymers generally used as a polymer for positive-tone resists for semiconductor lithography can be used without any specific limitation.

Among these, as the unit A, any repeating units conventionally used for resists may be used without a specific limitation. As the method for introducing the unit A into the resist polymer, a method of copolymerizing monomers having a structure which decomposes by the action of an acid and becomes alkali-soluble or a method of copolymerizing monomers having an alkali-soluble structure and protecting this alkali-soluble group with an acid-dissociable group (acid-dissociable protective group) can be given. The unit A inhibits unexposed areas of the resist from being dissolved in an alkali solution and causes the acid-dissociable protective groups on the exposed areas to be removed, thereby rendering the resist polymer of those areas to become alkali-soluble.

As examples of the monomers having a structure which is decomposed by an acid and becomes alkali-soluble, polymerizable compounds containing an alkali-soluble group bonded with an acid-dissociable protective group, for example, compounds having a phenolic hydroxyl group, carboxyl group, hydroxyfluoroalkyl group, or the like protected by a non-polar acid-dissociable protective group can be given.

The following groups can be given as specific examples of the polymerizable compounds containing such an alkali-soluble group: hydroxystyrenes such as p-hydroxystyrene, m-hydroxystyrene, and p-hydroxy-α-methylstyrene; carboxylic acids having an ethylenic double bond such as acrylic acid, methacrylic acid, maleic acid, fumaric acid, α-trifluoromethylacrylic acid, 5-norbornene-2-carboxylic acid, 2-trifluoromethyl-5-norbornene-2-carboxylic acid, and carboxytetracyclo[4.4.0.1$^{2,5}$1$^{7,10}$]dodecyl methacrylate; and polymerizable compounds having a hydroxyfluoroalkyl group such as p-(2-hydroxy-1,1,1,3,3,3-hexafluoro-2-propyl)styrene, 2-(4-(2-hydroxy-1,1,1,3,3,3-hexafluoro-2-propyl)cyclohexyl)-1,1,1,3,3,3-hexafluoropropyl acrylate, 2-(4-(2-hydroxy-1,1,1,3,3,3-hexafluoro-2-propyl) cyclohexyl)-1, 1,1,3,3,3-hexafluoropropyltrifluoromethyl acrylate, and 5-(2-hydroxy-1,1,1,3,3,3-hexafluoro-2-propyl)methyl-2-norbornene.

As examples of the acid-dissociable protective group bonded with the above-mentioned alkali-soluble groups, saturated hydrocarbon groups such as a tert-butyl group, tert-amyl group, 1-methyl-1-cyclopentyl group, 1-ethyl-1-cyclopentyl group, 1-methyl-1-cyclohexyl group, 1-ethyl-1-cyclohexyl group, 2-methyl-2-adamantyl group, 2-ethyl-2-adamantyl group, 2-propyl-2-adamantyl group, 2-(1-adamantyl)-2-propyl group, 8-methyl-8-tricyclo[5.2.1.0$^{2,6}$] decanyl group, 8-ethyl-8-tricyclo[5.2.1.0$^{2,6}$]decanyl group, 8-methyl-8-tetracyclo[4.4.0.1$^{2,5}$.1$^{7,10}$]dodecanyl group, and 8-ethyl-8-tetracyclo[4.4.0.1$^{2,5}$.1$^{7,10}$]dodecanyl group; oxygen-containing hydrocarbon groups such as a 1-methoxyethyl group, 2-ethoxyethyl group, 1-isopropoxyethyl group, 1-n-butoxyethyl group, 1-tert-butoxyethyl group, 1-cyclopentyloxyethyl group, 1-cyclohexyloxyethyl group, 1-tricyclo[5.2.1.0$^{2,6}$]decanyloxyethyl group, 1-methoxymethyl group, 2-ethoxymethyl group, 1-isopropoxymethyl group, 1-n-butoxymethyl group, 1-tert-butoxymethyl group, 1-cyclopentyloxymethyl group, 1-cyclohexyloxymethyl group, 1-tricyclo[5.2.1.0$^{2,6}$]decanyloxymethyl group, and tert-butoxycarbonyl group; and the like can be given.

In the case in which the alkali-soluble group is protected by an acid-dissociable protective group after copolymerization of monomers having an alkali-soluble structure, a polymerizable compound containing the above-mentioned alkali-soluble group is copolymerized and an acid-dissociable protective group is introduced by reacting the resulting product with a compound providing a substituent not dissolvable in an alkali such as vinyl ether and halogenated alkyl ether in the presence of an acid catalyst. As the acid catalyst used for this reaction, p-toluenesulfonic acid, trifluoroacetic acid, strongly acidic ion-exchange resin, and the like can be mentioned.

As the unit A being decomposed by an acid and becoming alkali-soluble, units containing an alicyclic skeleton having 5-20 carbon atoms are preferable in view of high etching resistivity of the resulting resist polymer. Although there are no specific limitations to the alicyclic skeleton having 5-20 carbon atoms, specific examples of preferable skeletons include a cyclopentane ring, cyclohexane ring, isobornane ring, norbornane ring, adamantane ring, tricyclo[5.2.1.0$^{2,6}$] decane ring, and tetracyclo[4.4.0.1$^{2,5}$.1$^{7,10}$]dodecane ring.

There are also no specific limitations to the monomer providing the unit B of the resist polymer. Compounds having a phenolic hydroxyl group, carboxyl group, hydroxyfluoroalkyl group, lactone structure, hydroxyalkyl group, or the like as a polar group can be given as preferable examples. As specific preferable examples, hydroxystyrenes, carboxylic acids having an ethylenic double bond, and polymerizable compounds having a hydroxyfluoroalkyl group mentioned above as the polymerizable compounds containing an alkali-soluble group, monomers obtainable by further substitution of a polar group on these compounds, and monomers obtainable by bonding of a polar group with an alicyclic structure such as a norbornene ring, tetracyclododecene ring, or the like can be given.

As the polar group of the monomer providing the unit B, groups containing a lactone structure are particularly preferable. Specific examples include substituents containing a lactone ring structure such as γ-butyrolactone, γ-valerolactone, δ-valerolactone, 1,3-cyclohexanecarbolactone, 2,6-norbornanecarbolactone, 4-oxatricyclo[5.2.1.0$^{2,6}$]decan-3-on, and δ-lactone mevalonate.

As specific examples of the hydroxyalkyl group of the monomer providing the unit B, a hydroxymethyl group, hydroxyethyl group, hydroxypropyl group, 3-hydroxy-1-adamantyl group, and the like can be given.

As the monomer providing the unit C which is optionally included in the resist polymer, aromatic compounds having an ethylenic double bond such as styrene, α-methylstyrene, p-methylstyrene, and indene; ester compounds obtainable by substitution of an acid-stable non-polar group on carboxylic acid having an ethylenic double bond such as acrylic acid, methacrylic acid, trifluoromethylacrylic acid, norbornene carboxylic acid, 2-trifluoromethylnorbornene carboxylic acid, and carboxytetracyclo[4.4.0.1$^{2,5}$.1$^{7,10}$]dodecyl methacrylate; alicyclic hydrocarbon compounds having an ethylenic double bond such as norbornene and tetracyclododecene; and the like can be given. As examples of the acid-stable non-polar substituent for the above-mentioned esters of carboxylic acids, a methyl group, ethyl group, cyclopentyl group, cyclohexyl group, isobornyl group, tricyclo [5.2.1.0$^{2,6}$]decanyl group, 2-adamantyl group, and tetracyclo [4.4.0.1$^{2,5}$1$^{7,10}$]dodecyl group can be given.

Either one of these monomers or a mixture of two or more of them may be used for each of the unit A, unit B, and unit C. The composition of the repeating units in the resulting resist polymer may be selected from a range not impairing the basic performance as the resist. Specifically, the copolymerization composition ratio of the unit A is preferably in a range of 10-70 mol %, and more preferably in a range of 10-60 mol %. The copolymerization composition ratio of the unit B is preferably in a range of 30-90 mol %, and more preferably in a range of 40-90 mol %, provided that the content of the monomer units having the same polar group is preferably 70 mol % or less. The copolymerization composition ratio of the unit C is preferably in a range of 0-50 mol %, and more preferably in a range of 0-40 mol %.

Next, the polymerization method of the resist polymer will be described. The resist polymer in the present invention can preferably be obtained by the radical polymerization of two or more polymerizable compounds selected from the above-mentioned monomers in the presence of a polymerization solvent using a polymerization initiator.

Any polymerization initiators commonly used as a radical generator may be used in the polymerization reaction without any specific limitations. Examples of such preferable polymerization initiators include azo compounds such as 2,2'-azobisisobutyronitrile, 2,2'-azobis(2-methylbutyronitrile), dimethyl 2,2'-azobisisobutyrate, 1,1'-azobis(cyclohexane-1-carbonitrile), and 4,4'-azobis(4-cyanovaleric acid); organic peroxides such as decanoyl peroxide, lauroyl peroxide, benzoyl peroxide, bis(3,5,5-trimethylhexanoyl) peroxide, succinic acid peroxide, and tert-butyl peroxy-2-ethylhexanoate; and the like. These polymerization initiators may be used either individually or in combination of two or more.

Although it is not necessary to use a chain transfer agent, known thiol compounds such as dodecylmercaptan, mercaptoethanol, mercaptopropanol, mercaptoacetic acid, mercaptopropionic acid, 4,4-bis(trifluoromethyl)-4-hydroxy-1-mercaptobutane, and the like may be used either alone or in combination of two or more.

The amounts of the polymerization initiators and chain transfer agents used in the polymerization reaction cannot be generically specified, because a specific amount varies according to the types of the raw material monomers, polymerization initiators, and chain transfer agents used in the polymerization reaction, and production conditions such as a polymerization temperature, polymerization solvent, polymerization method, purification conditions, and the like. Optimal amounts for producing a polymer with a desired molecular weight are appropriately selected. In general, if the weight average molecular weight of the resist polymer is too great, the solubility of the resist polymer in the solvent for coating-film formation or in the alkaline developer is small, whereas if too small, the coating performance is impaired. For these reasons, the weight average molecular weight is preferably adjusted in a range of 2,000-40,000, and more preferably 3,000-30,000.

As the polymerization process for producing the resist polymer, solution polymerization is preferable, in which the raw material monomers are radically copolymerized in a polymerization solution containing a polymerization initiator and optionally a chain transfer agent. The solution polymerization can be carried out by a package polymerization method in which all monomers, polymerization initiators, and, as required, chain transfer agents are dissolved in a polymerization solvent and heated to the polymerization temperature, a polymerization initiator addition method in which the monomers are dissolved in a solvent and the polymerization initiator is added after heating the monomer solution to the polymerization temperature, a dripping polymerization method in which all or a portion of monomers, polymerization initiators, and chain transfer agents are dropped into the polymerization system heated to the polymerization temperature individually or as a mixture, or the like. Of these, the dripping polymerization is a suitable method for decreasing differences among lots. In particular, a method of separately dripping the monomers and polymerization initiators is preferable for ensuring stability of the monomers to be added during the dripping operation.

There are no specific limitations to the solvent used, insofar as the solvent can dissolve the raw monomers, copolymers obtained by polymerization, polymerization initiators, and chain transfer agents in a stable manner. As examples of the polymerization solvent, ketones such as acetone, methyl ethyl ketone, methyl amyl ketone, and cyclohexanone; ethers such as tetrahydrofuran, dioxane, ethylene glycol dimethyl ether, diethylene glycol dimethyl ether, diethylene glycol monoethyl ether, propylene glycol monomethyl ether; esters such as ethyl acetate and ethyl lactate; ether esters such as propylene glycol methyl ether acetate; lactones such as γ-butyrolactone; and the like can be given. These solvents may be used either individually or in combination of two or more. Although there are no specific limitations, the polymerization solvent is used usually in an amount of 0.5-20 parts by weight, and preferably 1-10 parts by weight for 1 part by weight of the monomers. If the amount of the solvent used is too small, there may be a case in which the monomers deposit or the solution becomes too viscous to maintain the polymerization system homogeneous. If the amount of the solvent is too great, the conversion rate of monomers may be insufficient and the molecular weight of the resist polymer may not be increased to a desired level.

Although there are no specific limitations to the polymerization reaction conditions, the reaction temperature is generally 60-100° C. Although the reaction time varies according to the method of polymerization and, therefore, cannot be generically specified, in the case of package polymerization, for example, the reaction time after the temperature has reached the polymerization temperature is selected from a range of 1-24 hours, and preferably 2-12 hours. In the case of the dripping polymerization, a longer dripping time is preferable to ensure a constant monomer composition, monomer concentration, and radical concentration in the polymerization system, as well as a homogeneous composition and molecular weight of the polymer produced during dripping. Too long a dripping time, however, is undesirable in view of productivity per hour and monomer stability in the dripping fluid. Therefore, the dripping time is selected from 0.5-20 hours, and preferably 1-10 hours. Because unreacted monomers remain in the reaction mixture after dripping, the reaction mixture is preferably aged for a prescribed period of time, while maintaining the polymerization temperature. The aging time is eight hours or less, and is preferably selected from 1-6 hours.

The polymerization reaction solution obtained by the above-mentioned polymerization reaction is caused to come in contact with a poor solvent to deposit a solid product (hereinafter referred to as "reprecipitation") to obtain the resist polymer as a purified solid by removing the solution portion by filtration or the like (this step is hereinafter referred to as "reprecipitation purification step"). As required, the solid obtained is washed with a poor solvent or a mixture of a poor solvent and a good solvent, and the resist polymer is obtained as a purified solid by removing the solution portion which contains impurities such as unreacted monomers, oligomers, polymerization initiators, chain transfer agents, and coupling products of these (hereinafter referred to as "unreacted monomers, etc.") by filtration or the like (this step is hereinafter referred to as "washing purification step"). The reprecipitation purification step may be repeated by drying the resulting solid, as required, and redissolving the dry product in a solvent containing a good solvent. Alternatively, the washing purification step may be repeated by drying the resulting solid, as required, and washing the dry product with a poor solvent or a mixture of a poor solvent and a good solvent.

Although there are no specific limitations to the good solvent used in each of the above-mentioned steps insofar as the solvent can dissolve the resulting copolymer and unreacted monomers, etc., the same polymerization solvent as mentioned above is preferable in view of the production process control. There are also no specific limitations to the poor solvent insofar as the solvent can cause the copolymer to deposit. As examples, water; alcohols such as methanol and isopropanol; saturated hydrocarbons such as hexane and heptane; and mixtures of these solvents can be given. In addition to independent use of the good solvent or poor solvent in each of the above-mentioned steps, combined use of a good solvent and poor solvent is preferable for adequately controlling the solubility of the resulting copolymer, unreacted monomers, etc.

Although unreacted monomers, etc. can be removed to some extent by the reprecipitation purification step and, as required, by the washing purification step, the solvent still remains. If the product is heated to evaporate such a solvent, the resist polymer may be decomposed. The resist polymer solution of the present invention can be prepared from the solid product containing the solvent used in the above purification steps and the resist polymer by a process comprising the step (1) and step (2) for removing such a solvent and, as required, unreacted monomers, etc.

Specifically, the resist polymer solution of the present invention can be obtained ultimately as a solution with a content of impurities, including low-boiling-point impurities such as mixed solvents and unreacted monomers, etc., of not more than 1 mass % for the resist polymer by removing these impurities by a process comprising the following step (1) and step (2):

(1) a redissolving step of redissolving a solid product containing the resist polymer in a solvent containing at least one solvent for coating-film formation (solvent (a)) and/or at least one solvent having a boiling point at atmospheric pressure not higher than the boiling point of the solvent (a) and (2) an impurity-removing step of evaporating the solvent (b) and/or any excessive amount of solvent (a) from the redissolved solution obtained in the step (1) while optionally adding the solvent (a) under reduced pressure.

The solvent used for redissolving the resist polymer in the step (1) preferably comprises a solvent (hereinafter "solvent (b)") having a boiling point not higher than the boiling point of the solvent for coating-film formation (hereinafter "solvent (a)") under atmospheric pressure.

The reason that the use of the solvent comprising the solvent (b) as the solvent for redissolving is preferable is as follows. Specifically, the solid product containing the resist polymer is not soluble in the solvent (a) in many cases, because such a solid product contains the poor solvent used in the reprecipitation purification step or the washing purification step. Therefore, a solvent that can dissolve the resist polymer faster than the solvent (a), specifically a solvent with a higher solubility, is required for redissolving. This is the reason that the solvent (b) must be used. In addition, the boiling point of the solvent (b) must not be higher than the boiling point of the solvent (a) under atmospheric pressure, because the solvent (b) must be removed before the resist, which is the final product, is produced. In view of the above requirements, economy, and the like, the use of the solvent (b) alone or a mixture of the solvent (b) and the later-described solvent (a) is particularly preferable for redissolving.

As the solvent (a), any solvents commonly used for forming coating-films of resists for semiconductor lithography can be used without specific limitations. Preferable solvents are cyclic or linear compounds having a boiling point of 140° C. or higher under atmospheric pressure and containing at least one polar group selected from the group consisting of a carbonyl group, ester group, ether group, and hydroxyl group. These solvents may be used either individually or in combination of two or more.

As specific examples of particularly preferable solvents (a), propylene glycol monomethyl ether acetate (boiling point 146° C.), ethyl lactate (boiling point 154.5° C.), cyclohexanone (boiling point 155.6° C.), methyl amyl ketone (boiling point 151.5° C.), diethylene glycol dimethyl ether (boiling point 162° C.), diethylene glycol monoethyl ether (boiling point 202° C.), and γ-butyrolactone (boiling point 204° C.) can be given.

As the solvent (b), although any solvents satisfying the above conditions can be used without any specific limitations, acetone, methyl ethyl ketone, tetrahydrofuran, dioxane, ethylene glycol dimethyl ether, propylene glycol monomethyl ether, and ethyl acetate can be given as specific examples. Of these, acetone, methyl ethyl ketone, tetrahydrofuran, ethylene glycol dimethyl ether, and ethyl acetate are preferable, with acetone, methyl ethyl ketone, and tetrahydrofuran being particularly preferable.

Since the solution after redissolution may contain very minute solids, insoluble foreign matter, metals, and the like, the solution is preferably passed through a filter having an average pore size of 0.5 μm or less, and preferably 0.1 μm or less, to remove these components.

Thus, the redissolved solution after purification obtained in the step (1) usually contains impurities which comprise components used, produced, or introduced during the polymerization step and purification step. Therefore, in order to obtain the resist polymer solution of the present invention, the redissolved solution after purification obtained in the above method is subjected to the impurity-removing step described below.

Specifically, although the step (2) is the impurity-removing step of evaporating the solvent (b) and/or any excessive amount of solvent (a) from the redissolved solution obtained in the step (1) while optionally adding the solvent (a) under reduced pressure, at the same time, it is possible to remove any impurities of which the boiling point is not higher than the boiling point of the solvent (a) (hereinafter referred to as "low-boiling-point impurities"). In addition, it is preferable to add an excess amount of the solvent (a) and evaporate such an excess amount at the same time.

The amount of the solvent (a) used in the process of the present invention, in terms of the total amount of the solvent (a) used in the step (1) and the solvent (a) supplied in the step (2), is 1.1 times or more, preferably 1.2 times or more, and particularly preferably 1.4 times or more of the solvent (a) included in the finally obtained resist polymer solution. If the amount of solvent (a) is too small, the low-boiling-point impurities may not be sufficiently removed. In the case in which the amount of solvent (a) supplied in the step (1) is equivalent to or more than the above required amount, the solvent (a) may not be added in the step (2).

On the other hand, the upper limit of the amount of solvent (a) is 10 times or less, preferably 5 times or less, and particularly preferably 3 times or less of the solvent (a) included in the finally obtained resist polymer solution. If too great an amount of solvent (a) is used, not only the productivity decreases, but also the excess amount of solvent (a) may impose a large heat load to the resist polymer when an excess amount of solvent (a) is evaporated under reduced pressure.

The heating temperature, vacuum degree, process time, and the like in the step (2) are appropriately determined according to the boiling point and amount of the solvent (a) and solvent (b) used; types, boiling points, and amounts of low-boiling-point impurities; and the like. In order to reduce the heat load to the resist polymer, it is usually desirable to control the heating temperature of the solution for evaporating the impurities preferably to 70° C. or less, more preferably to 60° C. or less, and particularly preferably to 55° C. or less. The vacuum degree is preferably selected from a range in which the solvents (a) and (b) and the low-boiling-point impurities are evaporated with ease at the process temperature.

In the process of the present invention, the amount of low-boiling-point impurities remaining in the resist polymer solution can be reduced to 1 mass % or less, and preferably to 0.5 mass % or less of the resist polymer contained in the solution by selecting the process conditions of the step (2).

The amount of the polymer in the ultimately obtained resist polymer solution is preferably in a range of 5-50 mass %, and more preferably 10-30 mass %.

When the resist polymer solution of the present invention obtained in this manner is used as a resist composition for semiconductor lithography, a photoacid generator and an acid diffusion controller such as a nitrogen-containing compound which inhibits diffusion of the acid in the area not exposed to radiation are added to the resist polymer solution. As the photoacid generator, photoacid generators commonly used as a resist raw material such as onium salt compounds, sulfone compounds, sulfonate compounds, sulfonimide compounds, disulfonyldiazomethane compounds, and the like can be used.

Moreover, compounds commonly used as additives for resists such as a dissolution controlling agent, a photosensitizer, and a dye can be further added to the resist composition, as required. Although there are no specific limitations to the amount of the components in the resist composition, the amount of the resist polymer, photoacid generator, and acid diffusion controller can be selected from the range respectively of 5-50 mass %, 0.1-10 mass %, and 0.001-10 mass % of the total amount of the resist composition including the solvent.

Conventionally, resist polymers after purification were removed as a powder from which purification solvents have been removed by a vacuum drying process and the like. However, since excessive drying of solids imposes an unnecessary heat load to the copolymer, the resist polymers may be decomposed by heat. According to the process of the present invention in which the purification solvent can be removed at a comparatively low temperature, the resist polymers can be efficiently produced without being decomposed. The process is excellent as compared with conventional methods.

EXAMPLES

The present invention will now be described in detail by way of examples, which should not be construed as limiting the present invention. In the Examples, % indicates mass %, unless otherwise indicated.

Example 1

A monomer solution preparation vessel maintained in nitrogen atmosphere was charged with 6.80 kg of methyl ethyl ketone (hereinafter abbreviated as "MEK"), 2.91 g of 5-acryloyloxy-2,6-norbornane carbolactone (hereinafter abbreviated as "NLA"), and 3.47 kg of 2-ethyl-2-adamantyl methacrylate (hereinafter abbreviated as "EAM"), and the mixture was dissolved to obtain a monomer solution. A polymerization initiator solution preparation vessel of which the internal atmosphere was replaced with nitrogen gas was charged with 1.00 kg of MEK and 0.11 kg of azobisisobutyronitrile (hereinafter abbreviated as "AIBN") and the mixture was dissolved to obtain a polymerization initiator solution.

Next, a polymerization vessel maintained in a nitrogen atmosphere was charged with 4.90 kg of MEK and heated to 80° C. while stirring. Then, the above monomer solution and polymerization initiator solution were added to the polymerization vessel maintained at 80° C. over four hours to polymerize. After the addition, the polymerization mixture was aged at 80° C. for two hours and allowed to cool to room temperature.

The polymer solution was dropped to 100 kg of hydromethanol to precipitate and filter the polymer. The resulting wet cake was washed with 100 kg of methanol and filtered.

The obtained solid was redissolved in 30 kg of MEK and filtered through a "40QSH" filter manufactured by CUNO Inc. Next, the solvent was replaced by discharging MEK, water, and methanol by heating under reduced pressure, while adding 25 kg of propylene glycol monomethyl ether acetate (hereinafter abbreviated as "PGMEA"), thereby obtaining 20 kg of PGMEA solution containing 25% of polymer. During the solvent replacement, the maximum vacuum was 0.6 kPa, the highest temperature was 49° C., and the period of time required for solvent replacement was 6 hours.

The composition of components added during the polymerization and the solvent replacement conditions are shown in Table 1. The composition, weight average molecular weight (Mw), and the molecular weight distribution (Mw/Mn) (Mn: number average molecular weight) of the polymer obtained, and the content of low-boiling-point impurities are shown in Table 2.

Example 2

A monomer solution preparation vessel maintained in a nitrogen atmosphere was charged with 9.00 kg of MEK, 1.85 kg of 5-methacryloyloxy-2,6-norbornane carbolactone (hereinafter abbreviated as "NLM"), 1.40 kg of 1-ethylcyclopentyl methacrylate (hereinafter abbreviated as "ECpM"), and 1.33 kg of 3-hydroxy-1-adamantyl methacrylate (hereinafter abbreviated as "HAM"), and the mixture was dissolved to obtain a monomer solution. A polymerization initiator solution preparation vessel of which the internal atmosphere was replaced with nitrogen gas was charged with 0.80 kg of MEK and 0.15 kg of AIBN. The mixture was dissolved to obtain a polymerization initiator solution.

Next, a polymerization vessel maintained in a nitrogen atmosphere was charged with 4.80 kg of MEK and heated to 80° C. while stirring. Then, the above monomer solution and polymerization initiator solution were added to the polymerization vessel maintained at 80° C. over four hours to polymerize.

After the addition, the polymerization mixture was aged at 80° C. for two hours and allowed to cool to room temperature. The polymer solution was dropped to 50 kg of hexane to precipitate and filter the polymer. The resulting wet cake was washed with 50 kg of a mixed solvent of MEK and hexane and filtered.

The obtained solid was redissolved in 30 kg of MEK and filtered through a "40QSH" filter manufactured by CUNO Inc. Next, the solvent was replaced by discharging MEK and hexane by heating under reduced pressure, while adding 18 kg of PGMEA, thereby obtaining 15 kg of PGMEA solution containing 25% of polymer.

The maximum vacuum was 0.7 kPa, the highest temperature was 50° C., and the period of time required for solvent replacement was 6 hours. The results are shown in Tables 1 and 2.

Example 3

A monomer solution preparation vessel maintained in a nitrogen atmosphere was charged with 19.30 kg of p-ethylphenol solution containing 23% of p-hydroxystyrene (hereinafter abbreviated as "PHS"), 23% of methanol, and 10% of water, 2.00 kg of EAM, and 0.40 kg of "AIBN", and the mixture was dissolved to obtain a monomer solution. Next, 5.00 kg of the monomer solution was fed to the polymerization vessel and heated to 80° C. while stirring. The remaining monomer solution was added to the polymerization vessel maintained at 80° C. over two hours and polymerized. After the addition, the polymerization mixture was aged at 80° C. for two hours and allowed to cool to room temperature.

The polymer solution was dropped to 60 kg of toluene to precipitate the polymer and remove the supernatant. The polymer was dissolved in 5 kg of acetone and reprecipitated in 60 kg toluene, followed by removal of the supernatant.

After repeating this procedure twice, the polymer was redissolved in 10 kg of acetone and filtered through a "40QSH" filter manufactured by CUNO Inc.

Then, acetone was removed by heating under reduced pressure, while adding 18 kg of ethyl lactate (hereinafter abbreviated as "EL"), thereby obtaining 17 kg of an EL solution containing 30% of polymer.

The maximum vacuum was 0.7 kPa, the highest temperature was 54° C., and the period of time required for solvent replacement was 6 hours. The results are shown in Tables 1 and 2.

Comparative Example 1

Monomers were polymerized and purified in the same manner as in Example 1. The resulting wet cake was removed without redissolving in MEK and, instead of being subjected to the solvent replacement step, was dried at 75° C. under a maximum vacuum of 0.7 kPa for 72 hours in a shelf-type vacuum drier. The resulting dry cake was dissolved in 15 kg of PGMEA, thereby obtaining 20 kg of a PGMEA solution containing 25% of polymer. The results are shown in Tables 1 and 2.

Comparative Example 2

Monomers were polymerized and purified in the same manner as in Example 2. The resulting wet cake was removed without redissolving in MEK and, instead of being subjected to the solvent replacement step, was dried at 75° C. under a maximum vacuum of 0.7 kPa for 72 hours in a shelf-type vacuum drier. The resulting dry cake was dissolved in 11 kg of PGMEA, thereby obtaining 15 kg of a PGMEA solution containing 25% of polymer. The results are shown in Tables 1 and 2.

Comparative Example 3

Monomers were polymerized and purified in the same manner as in Example 3. The resulting wet cake was removed without redissolving in acetone and, instead of being subjected to the solvent replacement step, was dried at 75° C. under a maximum vacuum of 0.7 kPa for 72 hours in a shelf-type vacuum drier. The resulting dry cake was dissolved in 11.6 kg of EL, thereby obtaining 17 kg of an EL solution containing 25% of polymer. The results are shown in Tables 1 and 2.

TABLE 1

|  |  | Example | | | Comparative Example | | |
| --- | --- | --- | --- | --- | --- | --- | --- |
|  |  | 1 | 2 | 3 | 1 | 2 | 3 |
| Composition | NLM | — | 37 | — | — | 37 | — |
| of charged | NLA | 50 | — | — | 50 | — | — |
| materials | EAM | 50 | — | 18 | 50 | — | 18 |
| (mol %) | ECpM | — | 34 | — | — | 34 | — |
|  | HAM | — | 29 | — | — | 29 | — |
|  | PHS | — | — | 82 | — | — | 82 |
| Impurity-removing method | | Present invention | Present invention | Present invention | Vacuum drying | Vacuum drying | Vacuum drying |
| Maximum vacuum (kPa) | | 0.6 | 0.7 | 0.7 | 0.7 | 0.7 | 0.7 |
| Highest temperature (° C.) | | 49 | 50 | 54 | 75 | 75 | 75 |
| Time period of process (hr) | | 6 | 6 | 6 | 72 | 72 | 72 |

TABLE 2

|  |  | Example | | | Comparative Example | | |
| --- | --- | --- | --- | --- | --- | --- | --- |
|  |  | 1 | 2 | 3 | 1 | 2 | 3 |
| Composition | NLM | — | 40 | — | — | 40 | — |
| determined by NMR | NLA | 50 | — | — | 50 | — | — |
| analysis (mol %) | EAM | 50 | — | 20 | 50 | — | 20 |
|  | ECpM | — | 30 | — | — | 30 | — |
|  | HAM | — | 30 | — | — | 30 | — |
|  | PHS | — | — | 80 | — | — | 80 |
|  | MA + AA | 0.0 | 0.0 | 0.0 | 0.3 | 0.5 | 0.4 |
| GPC analysis | Mw | 8,400 | 11,600 | 13,100 | 8,500 | 11,500 | 13,000 |
|  | Mw/Mn | 2.04 | 1.82 | 1.85 | 2.05 | 1.83 | 1.86 |
| Low-boiling-point impurities (mass %) | Organic materials | 0.3 | 0.3 | 0.2 | 3.7 | 7.5 | 6.3 |
|  | Water | 0.1 | 0.1 | 0.1 | 0.5 | 0.2 | 0.7 |

In Table 2, "MA+AA" indicates the molar ratio (%) of methacrylic acid unit (MA) and acrylic acid unit (AA).

The amount of low-boiling-point impurities is the content (mass %) in the resist polymer.

As shown by the above results, the process for producing the resist polymer solution of the present invention can significantly reduce the working hours as compared with conventional processes and can efficiently produce the resist polymer solution.

In addition, as compared with conventional processes in which a part of acid-decomposable repeating units in the resist polymer solution are decomposed into methacrylic acid or acrylic acid groups due to insufficient removal of low-boiling-point impurities, decomposition of acid-decomposable repeating units did not occur in the resist polymer solution obtained by the present invention which contains only a very small amount of low-boiling-point impurities, that is, 0.5 mass % or less in the resist polymer.

INDUSTRIAL APPLICABILITY

The resist polymer solution obtained by the present invention contains only a small amount of low-boiling-point impurities and the polymer contained therein is not decomposed.

Therefore, this resist polymer solution can achieve stable lithographic characteristics and provides almost no adverse effect on irradiation equipment due to volatile matter when used in semiconductor lithography. The resist polymer solution thus can be suitably used for resist compositions for semiconductor lithography.

The invention claimed is:

1. A process for producing a purified resist polymer solution, comprising:
   (1) dissolving a solid product comprising a resist polymer comprising a repeating unit decomposable by, and becoming alkali-soluble by, the action of an acid and a polar group-containing repeating unit, in a solvent (b) comprising one or more solvents selected from the group consisting of acetone, methyl ethyl ketone, tetrahydrofuran, ethylene glycol dimethyl ether, and ethyl acetate, and
   (2) evaporating from the solution obtained in (1) the solvent (b) while adding, under reduced pressure with the temperature being controlled at 70° C. or less, a solvent (a) comprising one or more solvents selected from the group consisting of propylene glycol monomethyl ether acetate, ethyl lactate, cyclohexanone, methyl amyl ketone, diethylene glycol dimethyl ether, diethylene glycol monoethyl ether, and γ-butyrolactone,
   wherein the boiling point of solvent (b) is not higher than the boiling point of solvent (a) at atmospheric pressure, and
   wherein the amount of impurities having a boiling point at atmospheric pressure of not more than the boiling point of the solvent (a) is 1 mass % or less of the resist polymer in the purified resist polymer solution.

2. The process of claim 1, wherein the repeating unit decomposable by the action of an acid and becoming alkali-soluble contains an alicyclic skeleton having 5-20 carbon atoms.

3. The process of claim 1, wherein the polar group-containing repeating unit comprises at least one polar group selected from the group consisting of a phenolic hydroxyl group, carboxyl group, hydroxyfluoroalkyl group, lactone structure, and hydroxyalkyl group.

4. The process of claim 1, wherein the amount of the resist polymer in the purified resist polymer solution is in a range of 5-50 mass %.

5. The process of claim 1, wherein the amount of the resist polymer in the purified resist polymer solution is in a range of 10-30 mass %.

6. The process of claim 1, wherein the rate of dissolution of the resist polymer in the solvent (b) is greater than the rate of dissolution of the resist polymer in the solvent (a).

7. The process of claim 1, wherein (2) is conducted with the temperature being controlled at 60° C. or less.

8. The process of claim 1, wherein (2) is conducted with the temperature being controlled at 55° C. or less.

9. The process of claim 1, wherein the amount of impurities having a boiling point at atmospheric pressure of not more than the boiling point of the solvent (b) is 0.5 mass % or less of the resist polymer in the purified resist polymer solution.

10. The process of claim 1, wherein solvent (b) is one or more solvents selected from the group consisting of acetone, methyl ethyl ketone, tetrahydrofuran, ethylene glycol dimethyl ether, and ethyl acetate.

11. The process of claim 1, wherein solvent (a) is one or more solvents selected from the group consisting of propylene glycol monomethyl ether acetate, ethyl lactate, cyclohexanone, methyl amyl ketone, diethylene glycol dimethyl ether, diethylene glycol monoethyl ether, and γ-butyrolactone.

12. The process of claim 1, wherein
   solvent (b) is one or more solvents selected from the group consisting of acetone, methyl ethyl ketone, tetrahydrofuran, ethylene glycol dimethyl ether, and ethyl acetate, and
   solvent (a) is one or more solvents selected from the group consisting of propylene glycol monomethyl ether acetate, ethyl lactate, cyclohexanone, methyl amyl ketone, diethylene glycol dimethyl ether, diethylene glycol monoethyl ether, and γ-butyrolactone.

* * * * *